(12) United States Patent
Kohli et al.

(10) Patent No.: US 7,465,635 B2
(45) Date of Patent: Dec. 16, 2008

(54) METHOD FOR MANUFACTURING A GATE SIDEWALL SPACER USING AN ENERGY BEAM TREATMENT

(75) Inventors: Puneet Kohli, Dallas, TX (US); Manoj Mehrotra, Plano, TX (US); Jin Zhao, Plano, TX (US); Sameer Ajmera, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 152 days.

(21) Appl. No.: 11/533,798

(22) Filed: Sep. 21, 2006

(65) Prior Publication Data

US 2008/0076225 A1   Mar. 27, 2008

(51) Int. Cl.
*H01L 21/336* (2006.01)

(52) U.S. Cl. .................. 438/301; 438/299; 438/303; 438/308; 438/653; 438/689; 257/E21.293

(58) Field of Classification Search ............. None
See application file for complete search history.

(56) References Cited

U.S. PATENT DOCUMENTS

| 7,002,209 B2 | 2/2006 | Chen et al. |
| 7,005,357 B2 * | 2/2006 | Ngo et al. ............... 438/303 |
| 2006/0014366 A1 | 1/2006 | Currie |
| 2006/0105106 A1 | 5/2006 | Balseanu et al. |
| 2006/0244074 A1 * | 11/2006 | Chen et al. ............... 257/371 |

* cited by examiner

*Primary Examiner*—N Drew Richards
*Assistant Examiner*—Kyoung Lee
(74) *Attorney, Agent, or Firm*—Wade J. Brady, III; Frederick J. Telecky, Jr.

(57) ABSTRACT

The present invention provides a method for manufacturing a semiconductor device. The method for manufacturing the semiconductor device, among other steps, may include forming a gate structure over a substrate, forming at least a portion of gate sidewall spacers proximate sidewalls of the gate structure, and subjecting the at least a portion of the gate sidewall spacers to an energy beam treatment, the energy beam treatment configured to change a stress of the at least a portion of the gate sidewall spacers, and thus change a stress in the substrate therebelow.

17 Claims, 13 Drawing Sheets

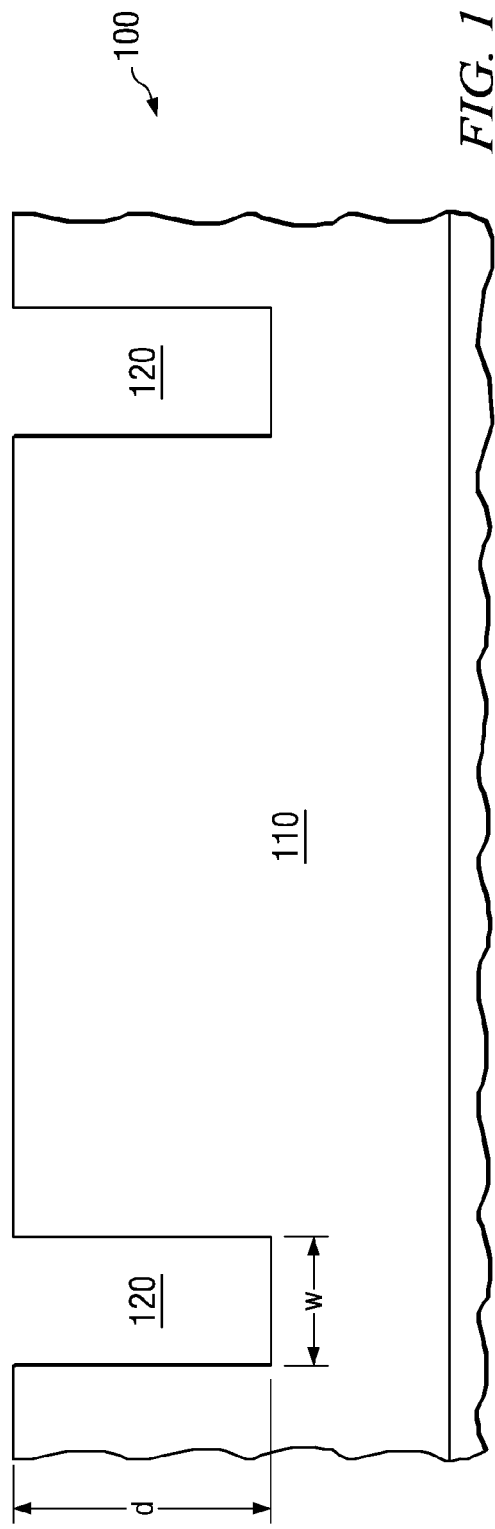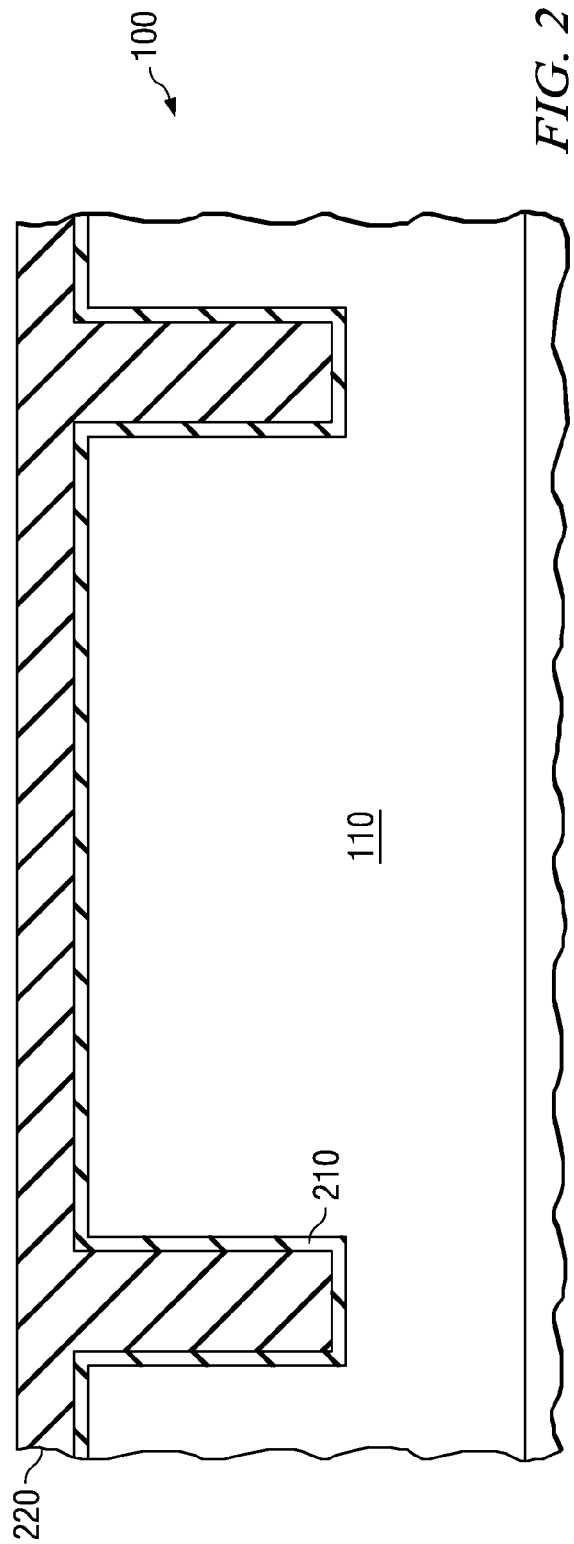

METHOD FOR MANUFACTURING A GATE SIDEWALL SPACER USING AN ENERGY BEAM TREATMENT

TECHNICAL FIELD OF THE INVENTION

The present invention is directed, in general, to a method for manufacturing a gate sidewall spacer and, more specifically, to a method for manufacturing a gate sidewall spacer using an energy beam treatment.

BACKGROUND OF THE INVENTION

There exists a continuing need to improve semiconductor device performance and further scale semiconductor devices. A characteristic that limits scalability and device performance is electron and/or hole mobility (e.g., also referred to as channel mobility) throughout the channel region of transistors. As devices continue to shrink in size, the channel region for transistors also continues to shrink in size, which can limit channel mobility.

One technique that may improve scaling limits and device performance is to introduce strain into the channel region, which can improve electron and/or hole mobility. Different types of strain, including expansive strain, uniaxial tensile strain, and compressive strain, have been introduced into channel regions of various types of transistors in order to determine their effect on electron and/or hole mobility. For some devices, certain types of strain improve mobility whereas other types degrade mobility.

One process known and used to create strain within the channel region is to form a thin layer of strain inducing material over the gate structure, and subject that layer of strain inducing material to an annealing process to create the strain within the channel region. Unfortunately, it has been observed that the introduction of strain into the channel region using such strain-inducing layers, alone, is insufficient to support some of the next generation devices.

Accordingly, what is needed in the art is an improved method for manufacturing a semiconductor device that provides improved channel mobility.

SUMMARY OF THE INVENTION

The present invention provides a method for manufacturing a semiconductor device. The method for manufacturing the semiconductor device, among other steps, may include forming a gate structure over a substrate, forming at least a portion of gate sidewall spacers proximate sidewalls of the gate structure, and subjecting the at least a portion of the gate sidewall spacers to an energy beam treatment, the energy beam treatment configured to change a stress of the at least a portion of the gate sidewall spacers, and thus change a stress in the substrate therebelow. The energy beam treatment may serve to chemically modify the one or more layers through the breaking and subsequent reforming of chemical bonds. Processing conditions during the energy beam treatment such as pressure, temperature, ambient gas chemistry, etc., can be specifically chosen to work in tandem with the energy beam to modify the one or more layers in the desired way.

The present invention further provides a method for manufacturing an integrated circuit. The method for manufacturing the integrated circuit, without limitation, may include forming gate structures over a substrate, and forming at least a portion of gate sidewall spacers proximate sidewalls of the gate structures. The method for manufacturing the integrated circuit may further include subjecting the at least a portion of the gate sidewall spacers to an energy beam treatment, the energy beam treatment configured to change a stress of the at least a portion of the gate sidewall spacers, and thus change a stress in the substrate therebelow. The method further includes forming interconnects within dielectric layers located over the gate structures, the interconnects configured to contact the gate structures.

The present invention additionally provides a semiconductor device. The semiconductor device, in one embodiment, includes (1) a semiconductor substrate, (2) a gate structure located over the substrate, (3) sidewall spacers located proximate a sidewall of the gate structure, at least a portion of the sidewall spacers subjected to an energy beam treatment to impart a stress in the substrate therebelow.

BRIEF DESCRIPTION OF THE DRAWINGS

For a more complete understanding of the present invention, reference is now made to the following descriptions taken in conjunction with the accompanying drawings, in which:

FIGS. 1-14 illustrate sectional views of detailed manufacturing steps instructing how one might, in one embodiment, manufacture a semiconductor device in accordance with the principles of the present invention.

DETAILED DESCRIPTION

Figure 3:
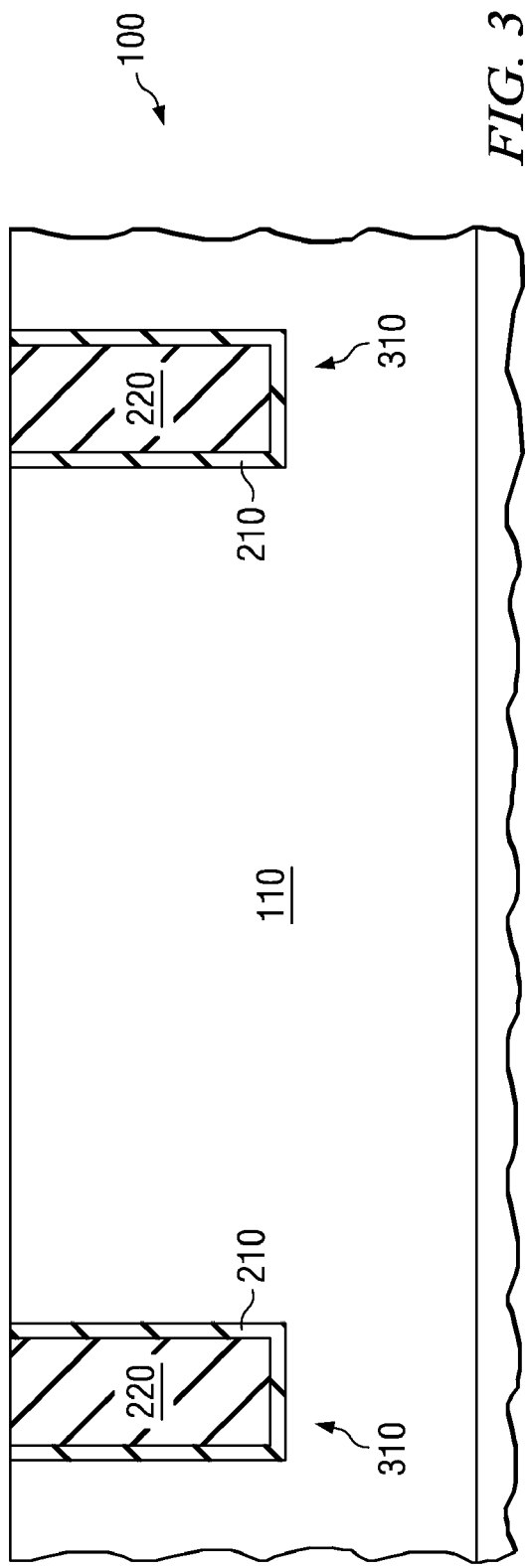

The present invention, is based at least in part, on the recognition that one or more layers used to form gate sidewall spacers may be subjected to an energy beam treatment (an ultraviolet (UV) energy beam treatment in one embodiment) to change a stress in a region of a substrate located therebelow. In one embodiment, the energy beam treatment changes the stress in a region of the substrate that will ultimately be a channel region of a semiconductor device. Accordingly, the changed stress may improve the performance of the semiconductor device.

Turning to FIGS. 1-14, illustrated are sectional views of detailed manufacturing steps instructing how one might, in one embodiment, manufacture a semiconductor device in accordance with the principles of the present invention. FIG. 1 illustrates a semiconductor device 100 at an initial stage of manufacture. The semiconductor device 100 of FIG. 1 includes a substrate 110. The substrate 110 may, in one embodiment, be any layer located in the semiconductor device 100, including a wafer itself or a layer located above the wafer (e.g., epitaxial layer). In the embodiment illustrated in FIG. 1, the substrate 110 is a P-type substrate; however, one skilled in the art understands that the substrate 110 could be an N-type substrate without departing from the scope of the present invention. In such a case, each of the dopant types described throughout the remainder of this document might be reversed. For clarity, no further reference to this opposite scheme will be discussed.

Located within the substrate 110 in the embodiment of FIG. 1 are openings 120. As those skilled in the art appreciate, and will be further apparent below, the openings 120 will ultimately form at least a portion of trench isolation structures. The openings 120 illustrated in FIG. 1 may have many different widths (w) and depths (d) while remaining within the purview of the present invention. Nevertheless, in one embodiment the widths (w) range from about 95 nm to about 100,000 nm and the depths (d) range from about 250 nm to about 400 nm. Other widths (w) and depths (d) outside of these ranges could be used.

Many different processes might be used to form the openings 120. For instance, in one embodiment photoresist could be conventionally spun on, exposed and developed to expose the regions where the openings 120 are desired. Thereafter, the exposed regions could be subjected to a silicon etch to form the openings 120 to a desired depth (d). Other embodiments might use the aforementioned photoresist in conjunction with a hard mask layer. Nevertheless, those skilled in the art understand the myriad of processes that might be used to form the openings 120.

Turning now to FIG. 2, illustrated is the semiconductor device 100 of FIG. 1 after forming one or more layers within the openings 120. In the embodiment of FIG. 2, a liner 210 has been formed within and along sidewalls of the openings 120. As is illustrated, the liner 210 is additionally formed over the upper surface of the substrate 110. The liner 210 may comprise an oxide, nitride or another liner material and remain within the scope of the present invention. Moreover, the liner 210 need not comprise a single layer, and thus may comprise two or more layers. In the embodiment wherein the liner 210 comprises two layers, the first layer might be an oxide and the second layer might be a nitride, or vice versa, among others.

The liner 210 may be formed using many different processes. For instance, the liner 210 may be deposited using a physical vapor deposition (PVD) process, chemical vapor deposition (CVD) process, plasma deposition process, or another similar process. As will be discussed more fully below, the process used to form the liner 210, as well as the materials used therefore, may be optimized so as to make the liner 210 most responsive in terms of changing the stress thereof when subjected to an energy beam treatment.

Located over the liner 210 and within the openings 120 is a layer of bulk plug material 220. As is illustrated, the layer of bulk plug material 220 is additionally formed over the upper surface of the substrate 110. The layer of bulk plug material 220, similar to the liner 210, may comprise an oxide, nitride or another bulk plug material and remain within the scope of the present invention.

The layer of bulk plug material 220 may also be formed using various different processes. For instance, the layer of bulk plug material 220 may be deposited using a physical vapor deposition (PVD) process, chemical vapor deposition (CVD) process, plasma deposition process, or another similar process. In one embodiment, the layer of bulk plug material 220 is deposited using a high-density plasma process based on an oxygen and silane chemistry. Other processes and chemistries could nonetheless be used. Similar to the liner 210, the process used to form the layer of bulk plug material 220, as well as the materials used to form the layer of bulk plug material 220, may be optimized so as to make the bulk plug material 220 most responsive in terms of changing the stress thereof when subjected to an energy beam treatment.

Turning now to FIG. 3, illustrated is the semiconductor device 100 of FIG. 2 after removing excess portions of the liner 210 and layer of bulk plug material 220 from over the substrate 110, thereby forming trench isolation structures 310. Those skilled in the art understand the processes that might be used to remove the excess portions of the liner 210 and layer of bulk plug material 220. In one embodiment, however, the excess portions are removed using a chemical mechanical polishing (CMP) process. The resulting trench isolations structures 310 would include the liner 210 and bulk plug portion 220.

At any stage in the manufacture of the trench isolation structure 310, one or more of the layers comprising the trench isolation structure 310 may be subjected to an energy beam treatment to change a stress of the one or more layers. Ideally, the change in stress of the one or more layers imparts a stress in the substrate located proximate the trench isolation structures 310, and more specifically between the trench isolation structures 310. In the embodiment of FIGS. 2-3 wherein the trench isolation structure 310 includes the liner 210 and the bulk plug 220, the liner 210 may be subjected to the energy beam treatment after its formation but prior to the formation of the layer of bulk plug material 220. Alternatively, the layer of bulk plug material 220 (and possibly the liner 210 if the energy beam treatment used is intense enough) may be subjected to the energy beam treatment after forming the layer of bulk plug material 220 and prior to polishing the excess portions thereof. Likewise, the bulk plug portion 220 (and possibly the liner 210 if the energy beam treatment used is intense enough) may be subjected to the energy beam treatment after polishing the excess portions thereof. In essence, any or all portions of the one or more layers that form the trench isolation structures 310 may be subjected to the energy beam treatment at any point in the manufacture thereof.

The energy beam treatment that the one or more layers of the trench isolation structures 310 are subjected to may vary. In one instance, the type of energy beam treatment may vary. In another instance, the processing conditions of the chosen energy beam treatment may vary. For instance, the energy beam treatment may be a UV energy beam treatment, electron beam treatment, or other similar energy beam treatment and remain within the purview of the present invention. In one embodiment, wherein the energy beam treatment is the UV energy beam treatment, one or more of the layers of the trench isolation structures 310 could be subjected to either a single wavelength of light ranging from about 130 nm to about 700 nm, multiple wavelengths of light ranging from 130 nm to 700 nm, or a full broadband dose of UV within this entire spectrum. The trench isolation structure 310 is generally subjected to the energy beam treatment for a time period ranging from about 60 seconds to about 60 minutes. In an alternative embodiment wherein the energy beam treatment is the electron beam treatment, one or more of the layers of the trench isolation structures 310 could be subjected to the electron beam treatment using a dose ranging from about 5 $\mu C/cm^2$ to about 5000 $\mu C/cm^2$. Other wavelengths, times, doses, etc. could also be used.

Figure 4:
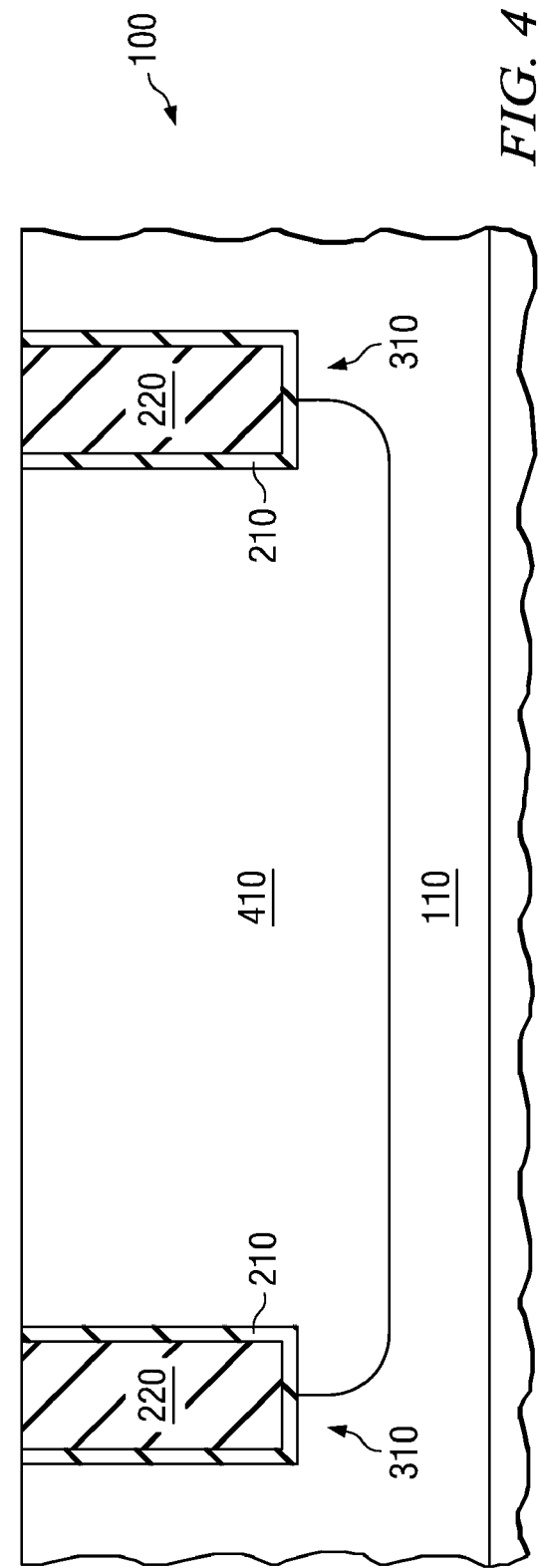

Turning to FIG. 4, illustrated is the semiconductor device 100 of FIG. 3 after forming a well region 410 in the substrate 110. The well region 410, in light of the P-type substrate 110, would more than likely contain an N-type dopant. For example, the well region 410 would likely be doped with an N-type dopant dose ranging from about 1E13 atoms/$cm^2$ to about 1E14 atoms/$cm^2$ and at an energy ranging from about 100 keV to about 500 keV. This results in the well region 410 having a peak dopant concentration ranging from about 5E17 atoms/$cm^3$ to about 1E19 atoms/$cm^3$. Many of the aspects of the well region 410, as well as its manufacture, may be conventional.

Figure 5:
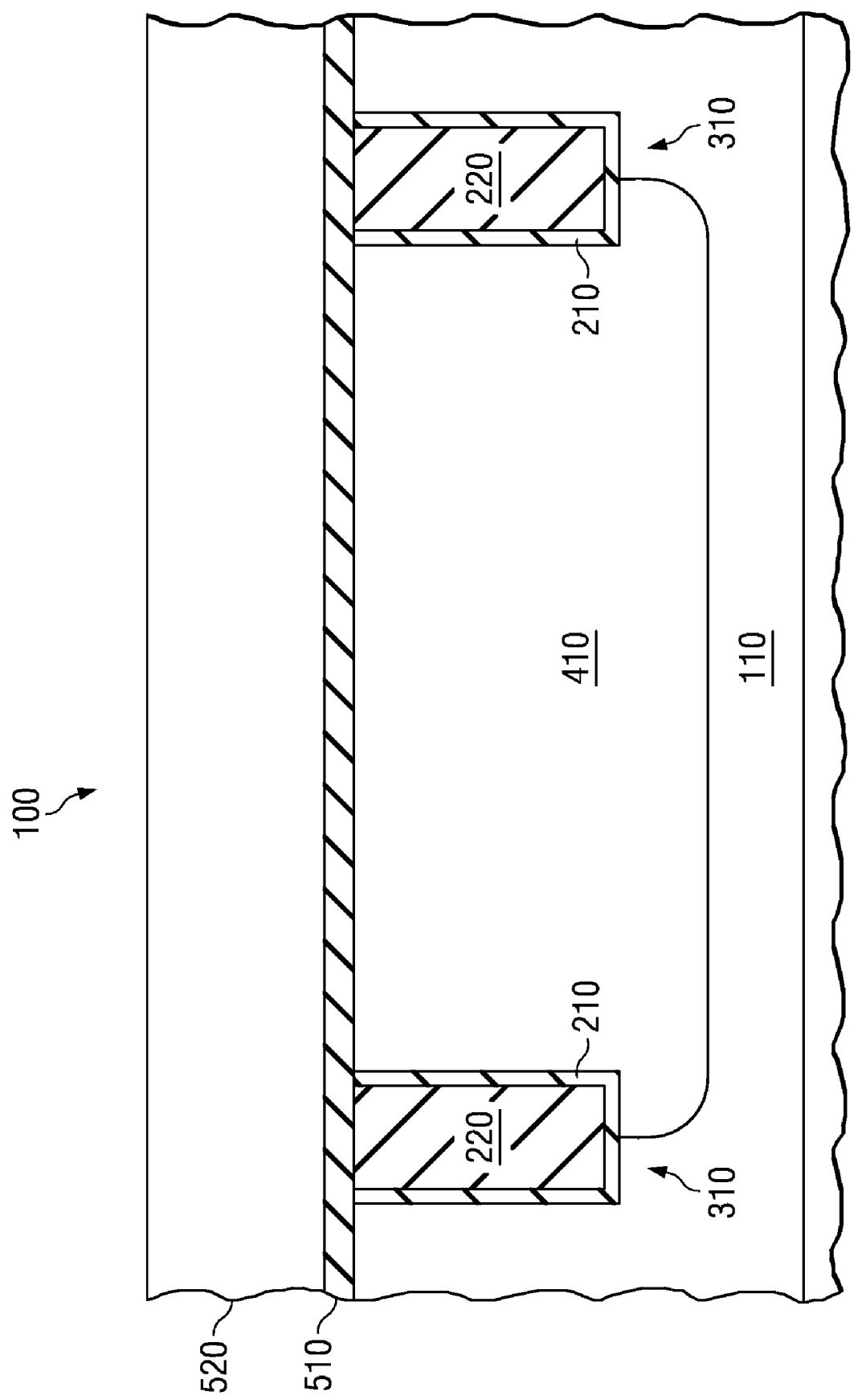

Turning now to FIG. 5, illustrated is the semiconductor device 100 of FIG. 4 after forming a layer of gate dielectric material 510 and a layer of gate electrode material 520 over the substrate 110. The layer of gate dielectric material 510 may comprise a number of different materials and stay within the scope of the present invention. For example, the layer of gate dielectric material 510 may comprise silicon dioxide, or in an alternative embodiment comprise a high dielectric constant (K) material, among others. In the illustrative embodiment of FIG. 5, however, the layer of gate dielectric material 510 is a silicon dioxide layer having a thickness ranging from about 0.5 nm to about 5 nm.

Any one of a plurality of manufacturing techniques could be used to form the layer of gate dielectric material 510. For example, the layer of gate dielectric material 510 may be either grown or deposited. Additionally, the growth or deposition steps may require a significant number of different temperatures, pressures, gasses, flow rates, etc.

The layer of gate electrode material 520 likewise may comprise a number of different materials and stay within the scope of the present invention. For example, layer of gate electrode material 520 may comprise standard polysilicon, or in an alternative embodiment comprise amorphous polysilicon, a silicided or silicideable material, a metal, or other gate electrode material. In the illustrative embodiment of FIG. 5, however, the layer of gate electrode material 520 is polysilicon having a thickness ranging from about 50 nm to about 150 nm. The layer of gate electrode material 520 may be formed using conventional processing conditions.

Figure 6:
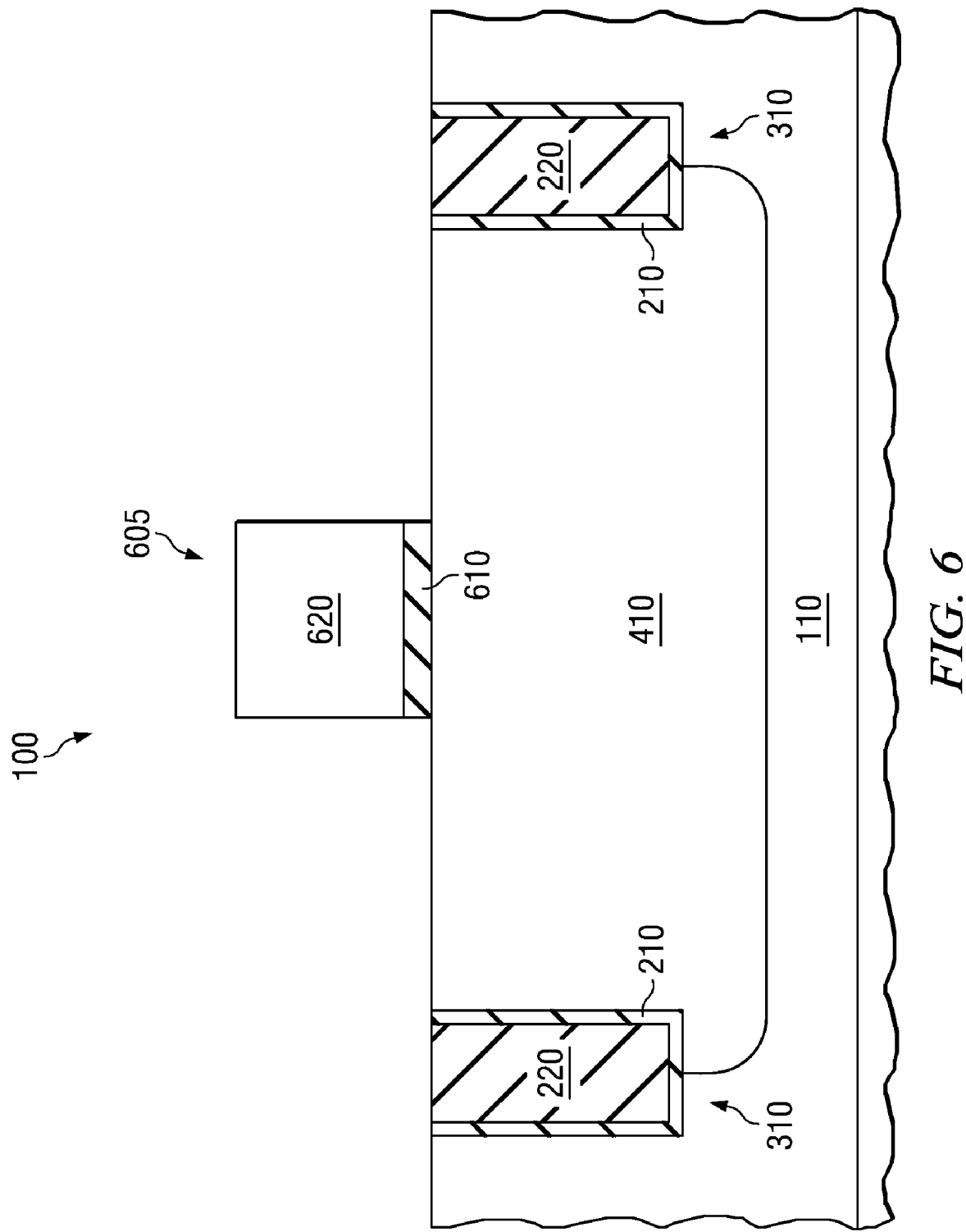

Turning briefly to FIG. 6, illustrated is the semiconductor device 100 of FIG. 5 after patterning the layer of gate dielectric material 510 and layer of gate electrode material 520 to form a gate structure 605. In the embodiment shown, the gate structure 605 may include a gate dielectric 610 and a gate electrode 620. Those skilled in the art understand that conventional processes may be used to pattern the gate structure 605.

Figure 7:
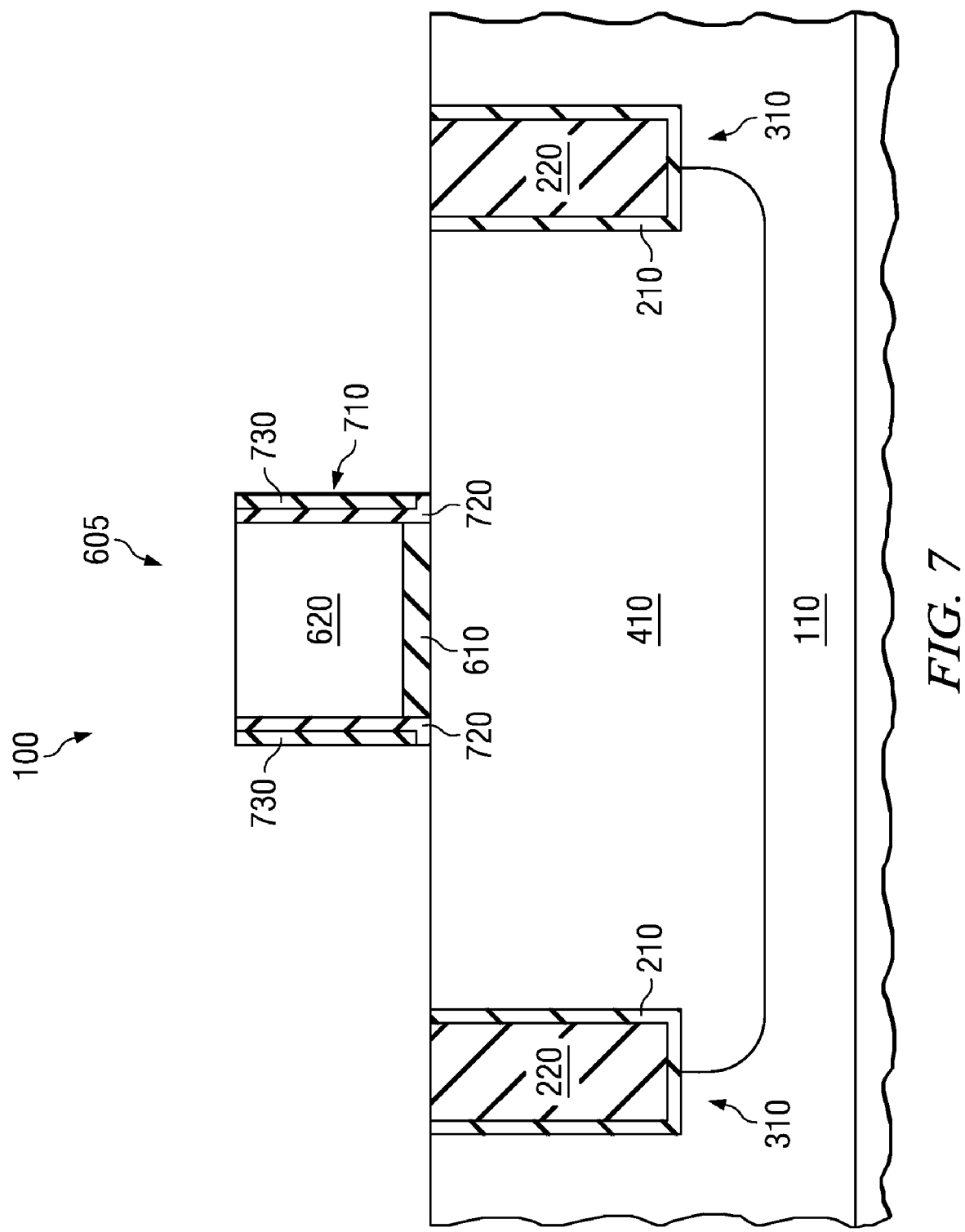

Turning now to FIG. 7, illustrated is the semiconductor device 100 of FIG. 6 after formation of portions of gate sidewall spacers 710. The portions of the gate sidewall spacers 710 shown in FIG. 7 include an oxide portion 720 and a nitride portion 730. The oxide portion 720 may comprise silicon dioxide, among others, and may be formed using a growth process, deposition process, or combination of a growth and deposition process. Alternatively, the nitride portion 730 may comprise a standard silicon nitride spacer or a silicon nitride layer having carbon therein, among others. While the oxide portion 720 and the nitride portion 730 are shown located only along the sides of the gate structure 605, those skilled in the art are aware that the layers were most likely previously formed along the entire semiconductor device 100 (e.g., blanket deposited) and subsequently anisotropically etched to form the oxide portion 720 and the nitride portion 730. Those skilled in the art understand, in addition to the processes disclosed, other conventional processes that might be used to manufacture the oxide portion 720 and nitride portion 730.

Figure 8:
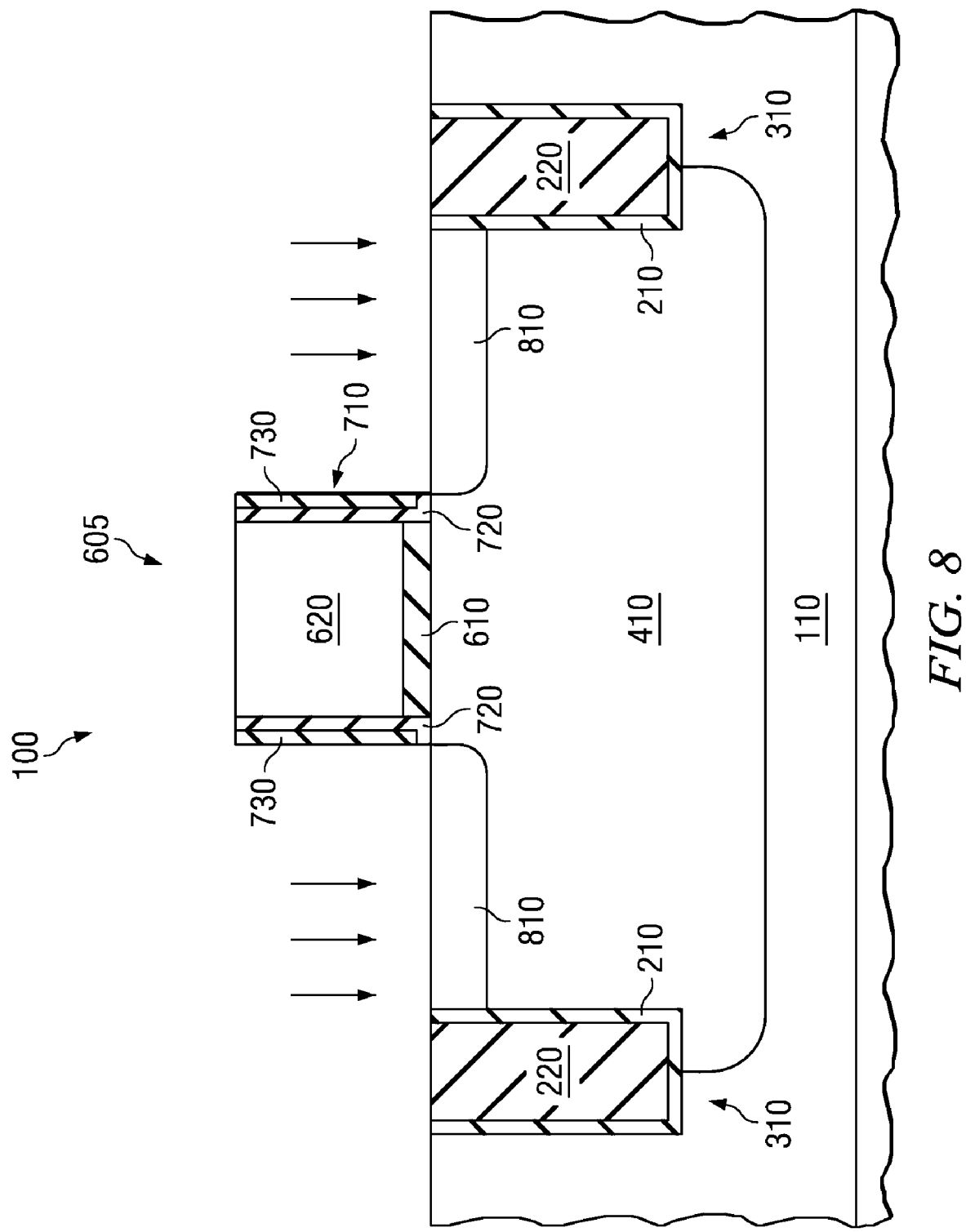

Turning now to FIG. 8, illustrated is the semiconductor device 100 of FIG. 7 after formation of extension implants 810 within the substrate 210. The extension implants 810 may be conventionally formed and generally have a peak dopant concentration ranging from about 1E19 atoms/cm$^3$ to about 2E20 atoms/cm$^3$. As is standard in the industry, the extension implants 810 may have a dopant type opposite to that of the well region 410 they are located within. Accordingly, the extension implants 810 are doped with a P-type dopant in the illustrative embodiment shown in FIG. 8.

Figure 9:
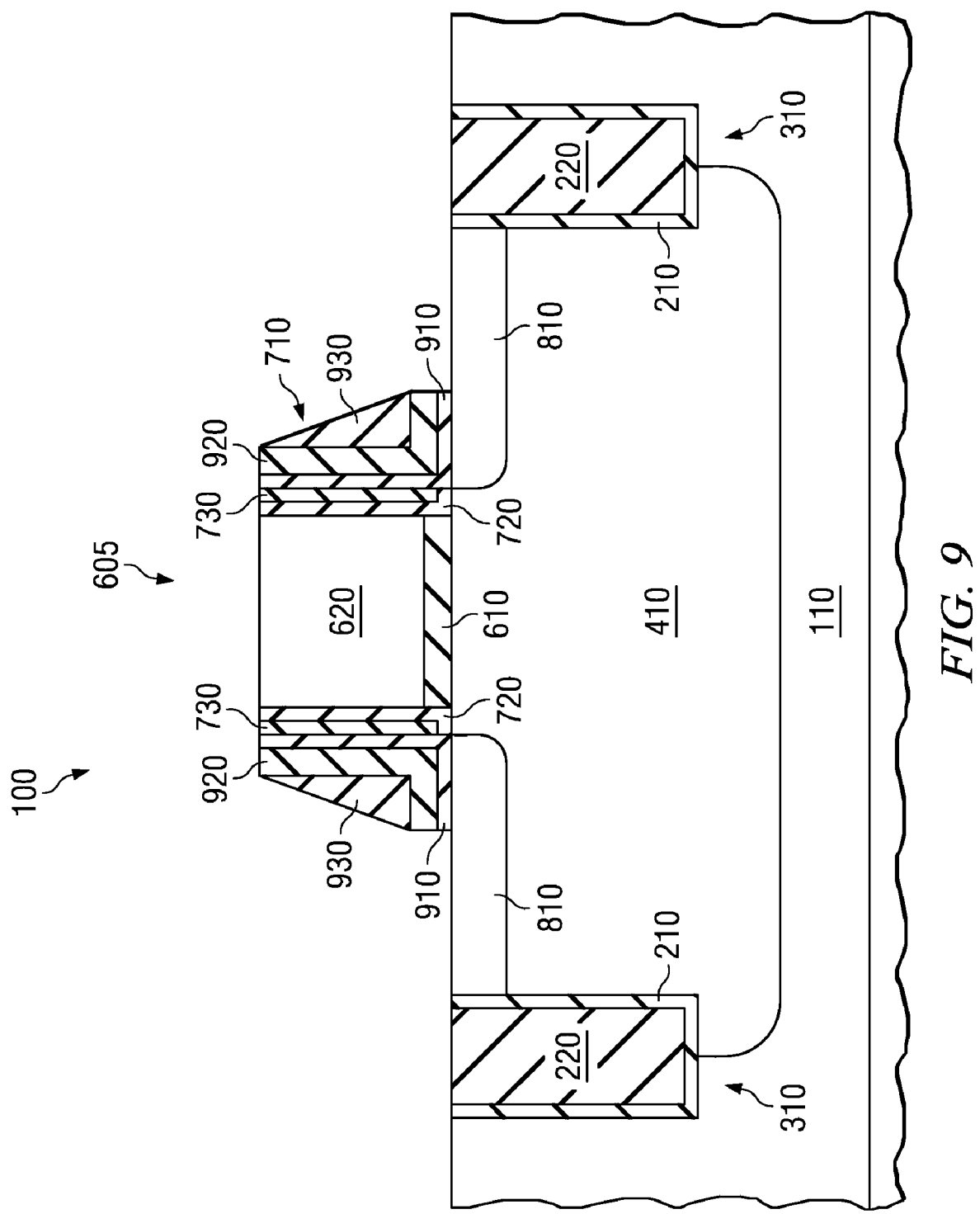

Turning now to FIG. 9, illustrated is the semiconductor device 100 of FIG. 8 after forming remaining portions of the gate sidewall spacers 710. Particularly, a cap portion 910, L-shaped portion 920 and bulk portion 930 complete the gate sidewall spacers 710. The cap portion 910, among other purposes, has the job of preventing the L-shaped portion 920 from directly contacting the substrate 110. In one embodiment, the cap portion 910 comprises an oxide. Most likely, the cap portion 910 will be deposited over the semiconductor device 100 using a process similar to that used to form the oxide portion 720.

The L-shaped portion 920 may comprise many different types of materials; however, in the embodiment shown the L-shaped portion 920 comprises a nitride material. Similarly, the bulk portion 930 may comprise many different types of materials. In the embodiment shown, however, the bulk portion 930 comprises an oxide material. Nevertheless, the materials and methods for forming the L-shaped portion 920 and bulk portion 930 may vary greatly.

The sidewall spacers 710 illustrated in FIGS. 7-9 show but one embodiment of a sidewall spacer in accordance with the principles of the present invention. For instance, another embodiment may exist wherein the sidewall spacers 710 only comprise the bulk portion. Another embodiment may exist wherein the sidewall spacers 710 comprise only the L-shaped portion and the bulk portion. Those skilled in the art appreciate that the novel aspects of the present invention are not based upon any specific sidewall spacer configuration, and thus could be applied to most any sidewall spacers.

At any stage in the manufacture of the gate sidewall spacers 710, one or more of the layers comprising the gate sidewall spacers 710 may be subjected to an energy beam treatment to change a stress thereof. In the embodiment of FIGS. 7-9 wherein the sidewall spacers 710 include the oxide portion 720, the nitride portion 730, the cap portion 910, the L-shaped portion 920 and the bulk portion 930, the oxide portion 720 may be subjected to the energy beam treatment after its formation but prior to the formation of any of the other layers. Likewise, the energy beam treatment could be conduced after formation of the nitride portion 730, or after the formation of the cap portion 910, or after formation of the L-shaped portion 920, or even after formation of the bulk portion 930.

It is possible that while subjecting a later formed feature of the sidewalls spacers 710 to the energy beam treatment that prior formed features will also be subjected to the energy beam treatment. In one embodiment, the energy beam treatment is tailored such that by subjecting the bulk portion 930 of the sidewall spacers 710 to the energy beam treatment, all previously formed portions of the sidewall spacers 710 would also be subjected to the energy beam treatment. In such an instance, the specific energy beam treatment used should be tailored to penetrate the various layers of the sidewall spacers 710. In an alternative embodiment, the energy beam treatment could be conducted at more than one stage of manufacture of the sidewall spacers 710, thus affecting one or more of the portions thereof. In essence, any or all portions of the one or more layers that form the sidewall spacers 710 may be subjected to the energy beam treatment at any point in the manufacture thereof.

The energy beam treatment that the one or more portions of the sidewall spacers 710 are subjected to may vary. In one instance, the type of energy beam treatment may vary. In another instance, the processing conditions of the chosen energy beam treatment may vary. For instance, the energy beam treatment may again be a UV energy beam treatment, electron beam treatment, or other similar energy beam treatment and remain within the purview of the present invention. In one embodiment, wherein the energy beam treatment is the UV energy beam treatment, one or more of the portions of the sidewall spacers 710 could be subjected to a wavelength of light ranging from about 130 nm to about 700 nm, for a time period ranging from about 60 seconds to about 60 minutes. In an alternative embodiment wherein the energy beam treatment is the electron beam treatment, one or more of the portions of the sidewall spacers 710 could be subjected to the electron beam treatment using a dose ranging from about 5 µC/cm² to about 5000 µC/cm². Other wavelengths, times, doses, etc. could also be used.

Figure 10:
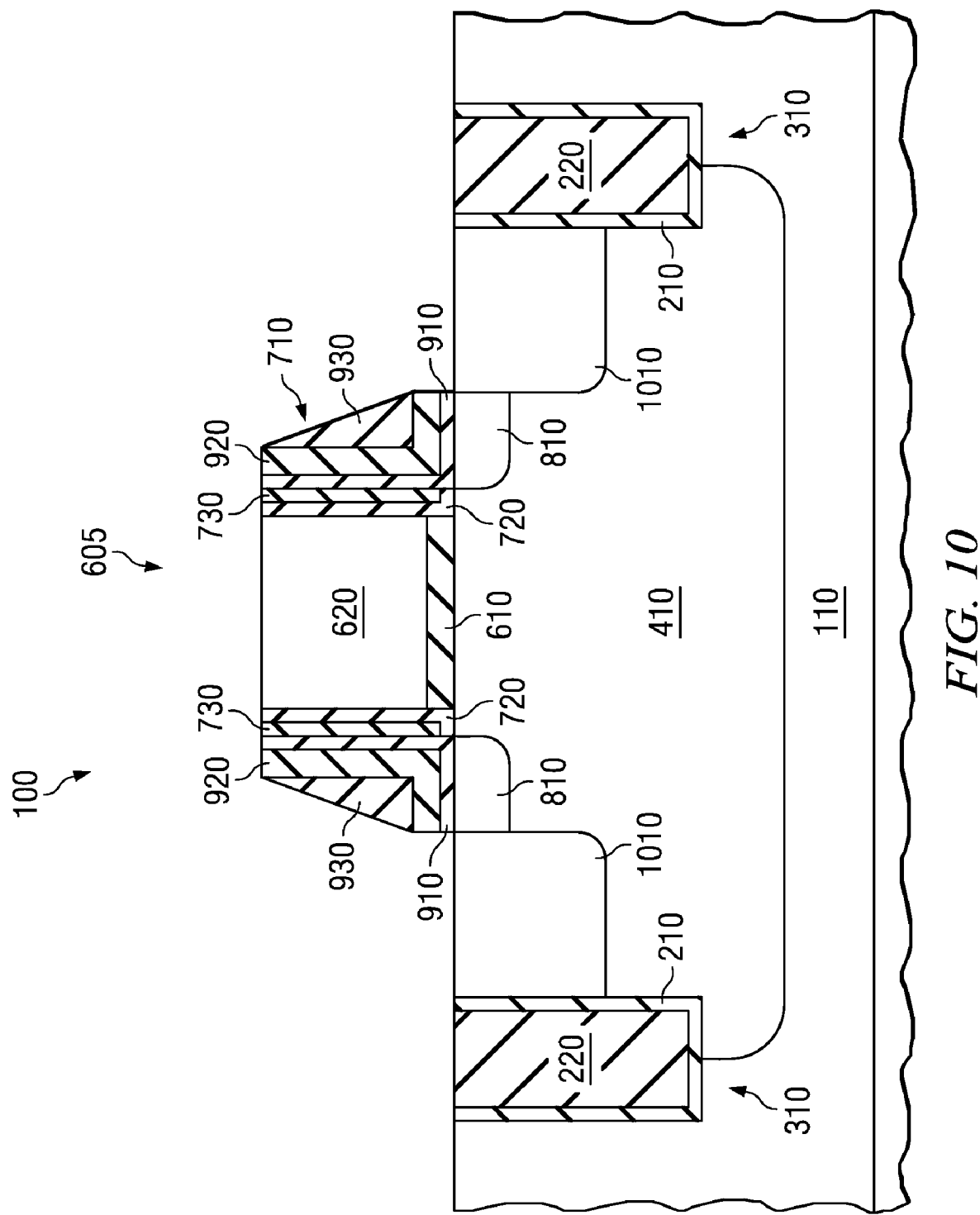

Turning now to FIG. 10, illustrated is the semiconductor device 100 of FIG. 9 after forming source/drain implants 1010 within the substrate 110. The formation of the source/drain implants 1010 may be conventional. Generally, the source/drain implants 1010 have a peak dopant concentration ranging from about 1E18 atoms/cm³ to about 1E21 atoms/cm³. Also, the source/drain implants 1010 typically have a dopant type opposite to that of the well region 410 they are located within. Accordingly, in the illustrative embodiment shown in FIG. 10, the source/drain implants 1010 are doped with a P-type dopant.

Figure 11:
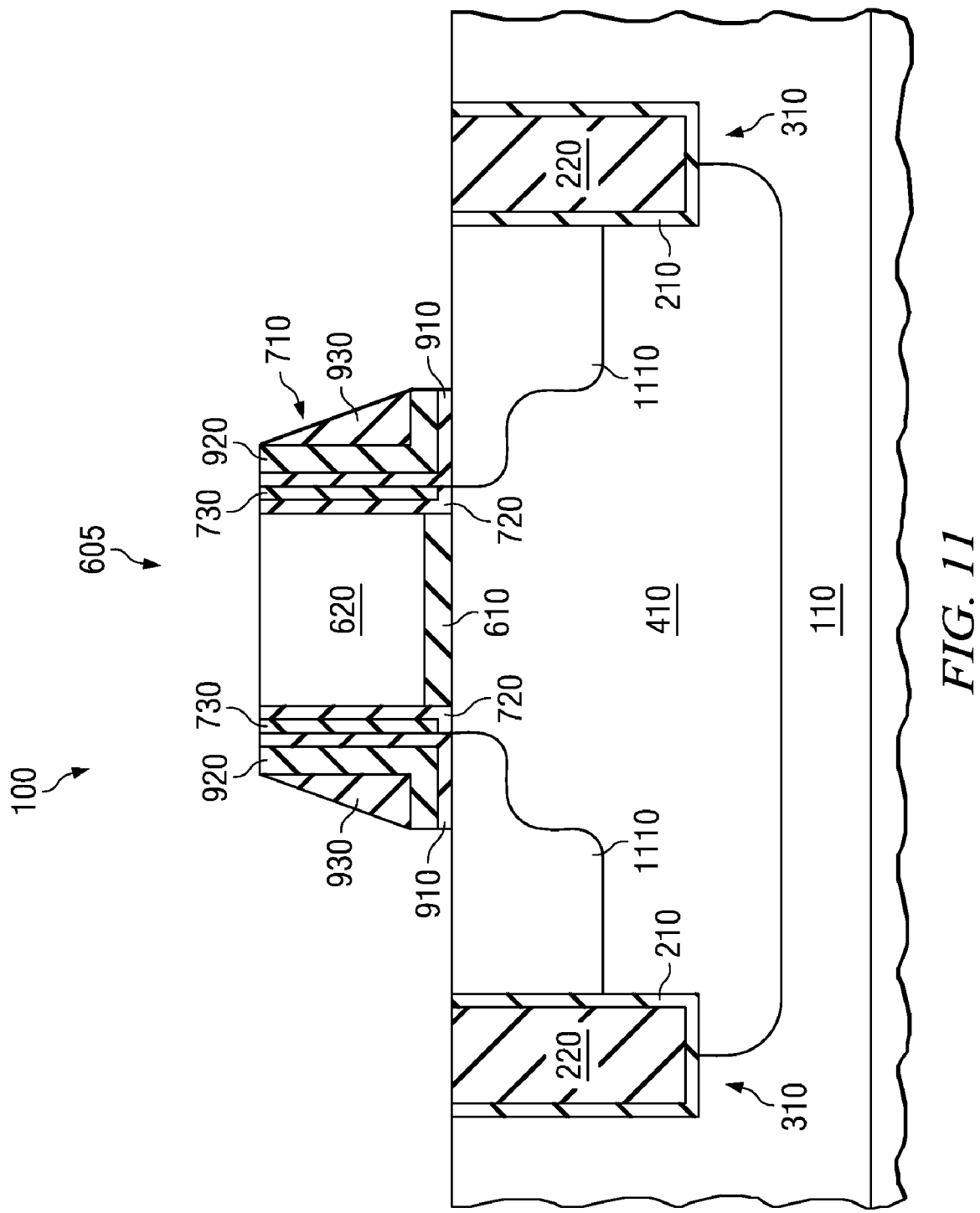

Turning now to FIG. 11, illustrated is the semiconductor device 100 of FIG. 10 after subjecting it to a standard source/drain anneal, thereby activating source/drain regions 1110. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drain regions 1110.

Figure 12:
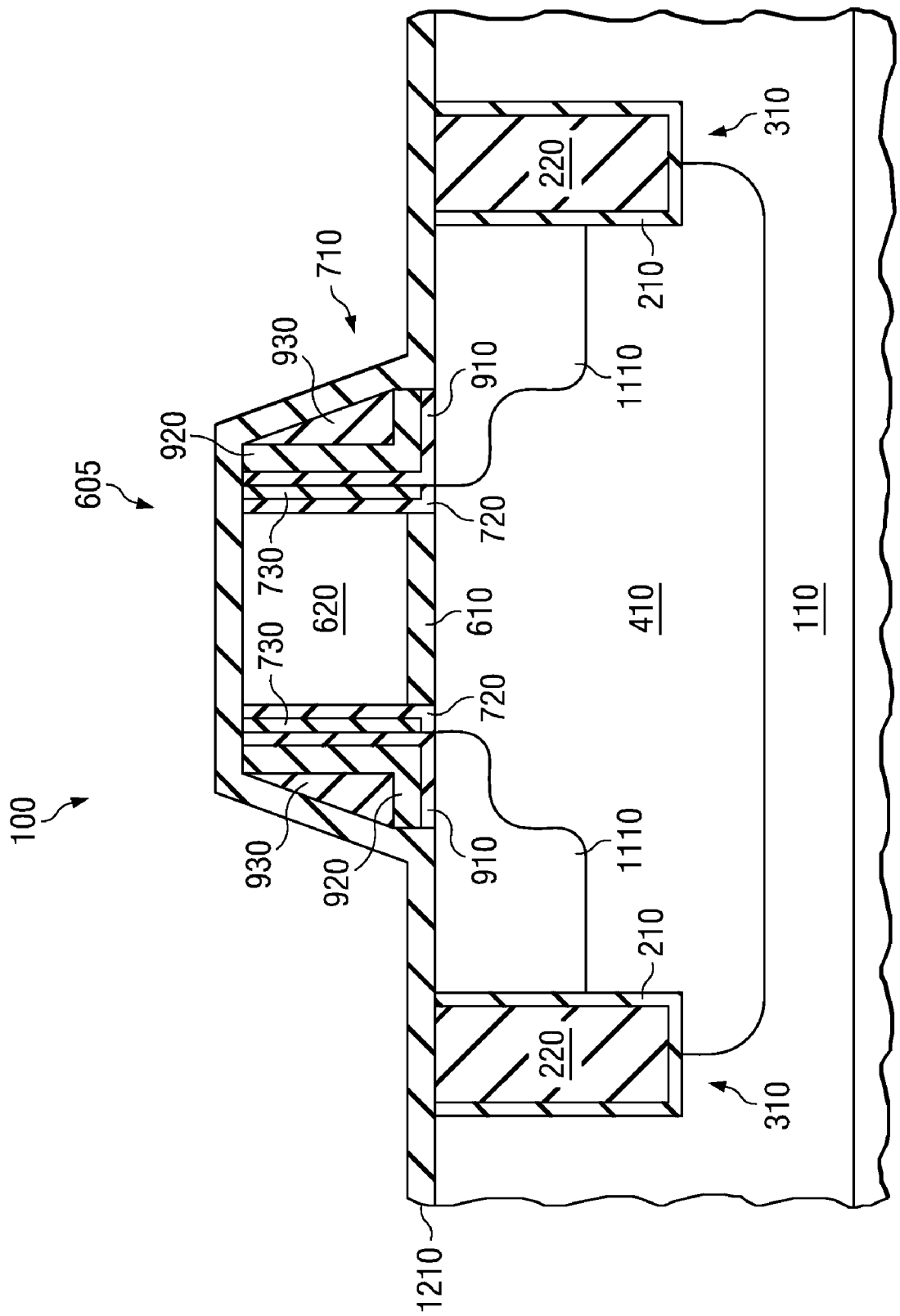

Turning now to FIG. 12, illustrated is the semiconductor device 100 of FIG. 11 after forming a pre-metal dielectric (PMD) liner 1210 over the gate structure 605. The PMD liner 1210, in one embodiment, comprises a nitride having a thickness ranging from about 10 nm to about 100 nm. In other embodiments, the PMD liner 1210 comprises a different material and/or thickness. The PMD liner 1210, among other purposes, is configured to act as an etch stop for the formation of contacts to the gate structure 605 and source/drain regions 1110. In certain other instances, the PMD liner 1210 is configured to introduce stress into the substrate 110. The PMD liner 1210, and all the materials and processes related thereto, may be conventional.

Figure 13:
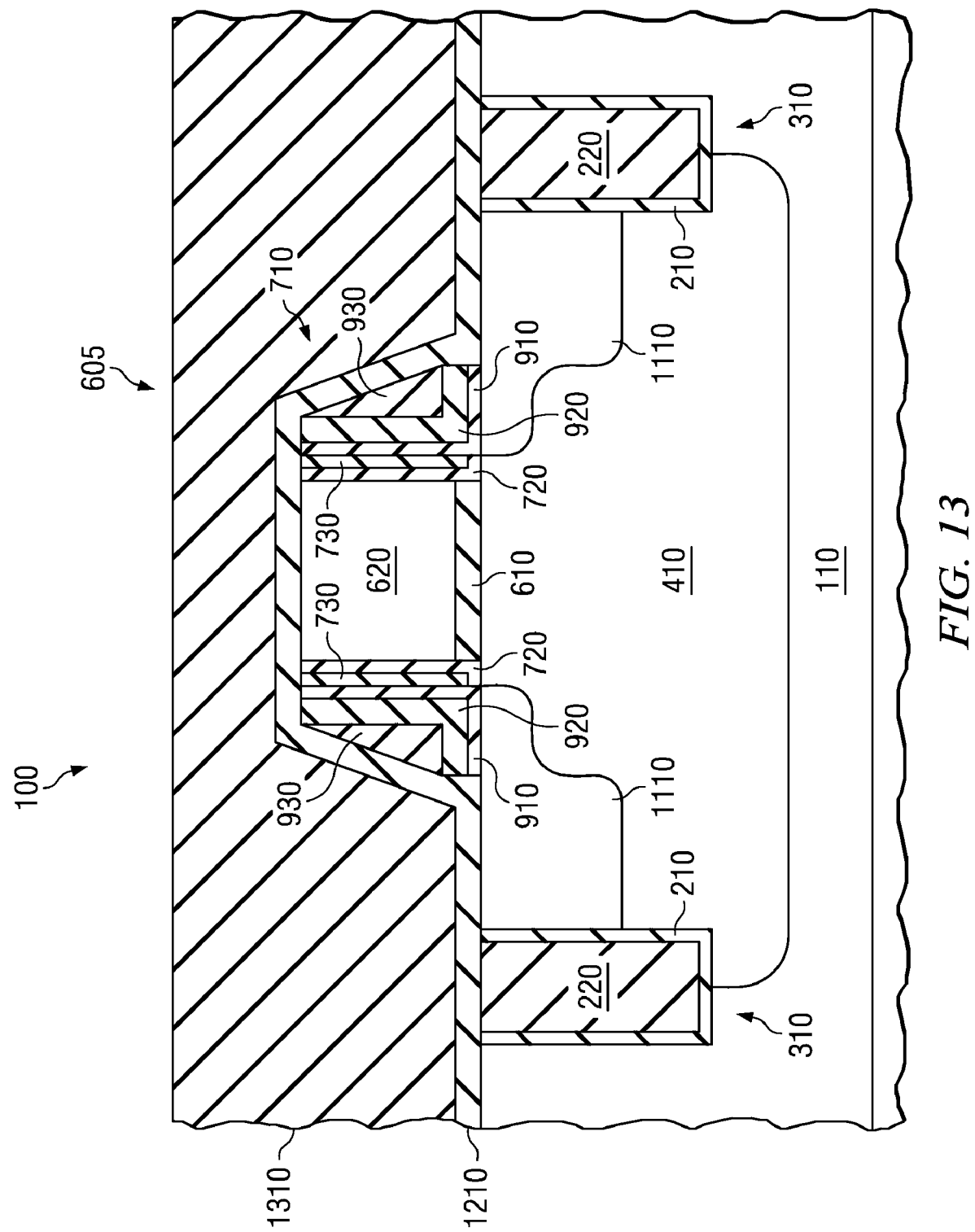

Turning now to FIG. 13, illustrated is the semiconductor device 100 of FIG. 12 after forming a pre-metal dielectric layer 1310 over the PMD liner 1210. The pre-metal dielectric layer 1310, in the embodiment of FIG. 13, functions as the dielectric layer separating the transistor level features from the features located at the first metal-level and above. In one embodiment, the pre-metal dielectric layer 1310 comprises an oxide, however, in another embodiment the pre-metal dielectric layer 1310 comprises a nitride. Nevertheless, the pre-metal dielectric layer 1310 may comprise other materials (e.g., low dielectric constant material), and well as may comprise more than one layer, or contain dopant elements (e.g., phosphorous), and remain within the purview of the present invention.

The pre-metal dielectric layer 1310, in one embodiment, should be formed so as to cover the gate structure 605. In the embodiment shown, the pre-metal dielectric layer 1310 would have a thickness ranging from about 200 nm to about 700 nm to achieve this. If the height of the gate structure 605 were to reduce, the thickness of the pre-metal dielectric layer 1310 might also reduce. Conventional processes, including depositing the pre-metal dielectric layer 1310 using a high-density plasma process based on an oxygen and silane chemistry, might be used to initially form the pre-metal dielectric layer 1310. A CMP may also be employed to achieve the flat profile as would be known to one skilled in the art.

Figure 14:
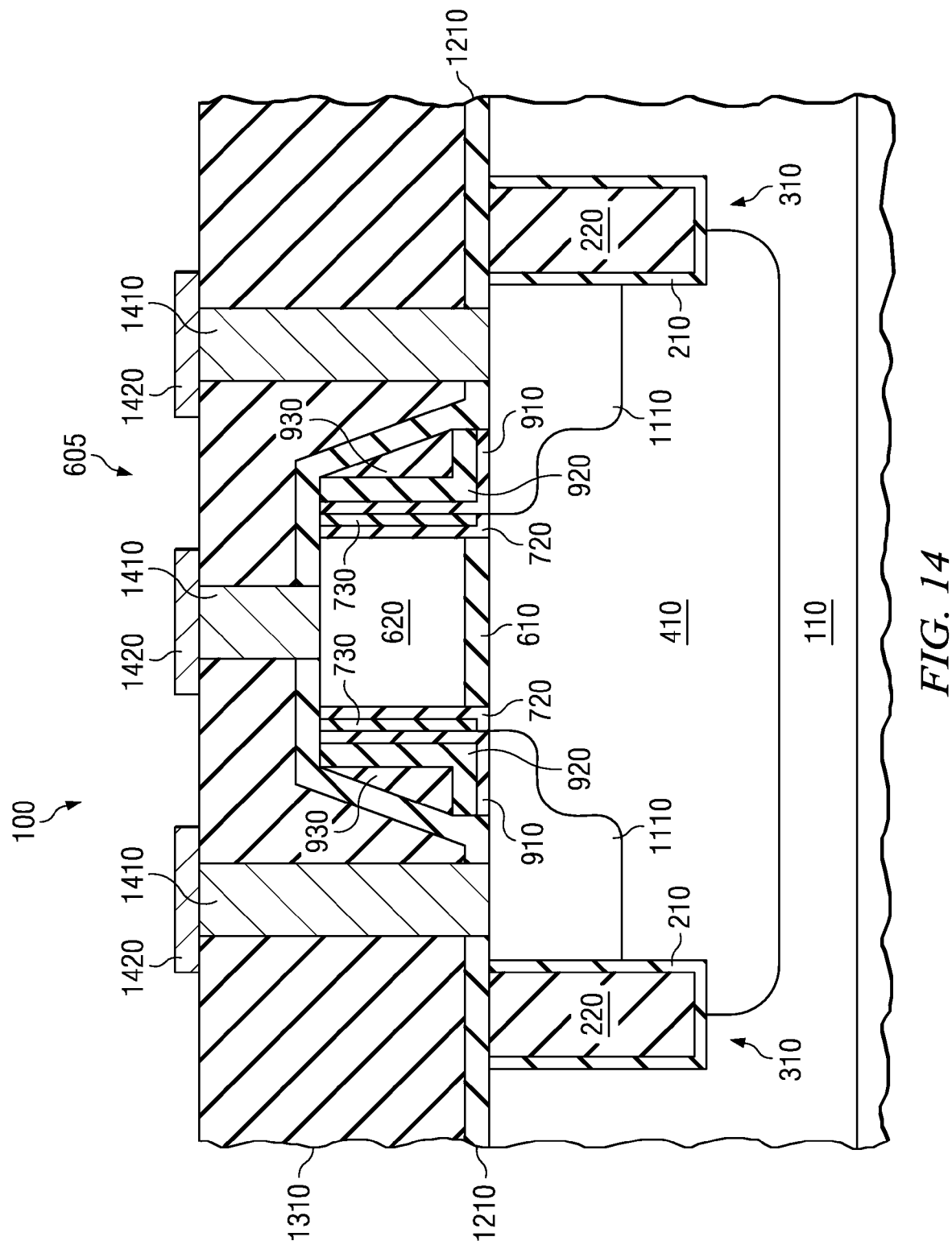

Turning now to FIG. 14, illustrated is the semiconductor device 100 of FIG. 13 after forming contacts 1410 within the pre-metal dielectric layer 1310, and first metal-level features 1420 over the contacts 1410. As those skilled in the art appreciate, the contacts 1410 and first metal-level features 1420 are designed to electrically contact the features therebelow. In the illustrative embodiment, the contacts 1410 and first metal-level features 1420 contact one or more of the source/drain regions 1110 and gate structure 620. Those skilled in the art appreciate the conventional processes and materials that might be used to manufacture the contacts 1410 and first metal-level features 1420.

At any stage in the manufacture of the pre-metal dielectric layer 1310, or after completion thereof (e.g., after formation of the contacts 1410 and first metal-level features 1420), the pre-metal dielectric layer 1310 may be subjected to an energy beam treatment to change a stress thereof. In the embodiment of FIGS. 13-14, the pre-metal dielectric layer 1310 could be subjected to the energy beam treatment after its formation and prior to the formation of the contacts 1410 and first metal-level features 1420. Alternatively, the pre-metal dielectric layer 1310 could be subjected to the energy beam treatment after formation of the contacts 1410 and prior to the formation of the first metal-level features 1420. Additionally, the pre-metal dielectric layer 1310 could be subjected to the energy beam treatment after formation of the first metal-level features 1420. In essence, the pre-metal dielectric layer 1310 may be subjected to the energy beam treatment at any point in the manufacture of the semiconductor device 100 that would cause its stress to increase.

The energy beam treatment that the pre-metal dielectric layer 1310 is subjected to may vary. In one instance, the type of energy beam treatment may vary. In another instance, the processing conditions of the chosen energy beam treatment may vary. For instance, the energy beam treatment may be a UV energy beam treatment, electron beam treatment, or other similar energy beam treatment and remain within the purview of the present invention. In one embodiment wherein the energy beam treatment is the UV energy beam treatment, the pre-metal dielectric layer 1310 could be subjected to a wavelength of light ranging from about 130 nm to about 700 nm, for a time period ranging from about 60 seconds to about 60 minutes. In an alternative embodiment wherein the energy beam treatment is the electron beam treatment, the pre-metal dielectric layer 1310 could be subjected to the electron beam treatment using a dose ranging from about 5 µC/cm² to about 5000 µC/cm². Other wavelengths, times, doses, etc. could also be used.

The present invention has been discussed with respect to conducting an energy beam treatment on three different distinct regions of the semiconductor device 100. It should be noted that any one or all of the three distinct regions may be subjected to the energy beam treatment and remain within the scope of the present invention. In those instances wherein extreme stress in the substrate is desired, all three of the distinct regions might be subjected to the energy beam treatment. In other embodiments wherein lesser amounts of stress in the substrate are desired, less than all three distinct regions might be subjected to the energy beam treatment. In general, the desires of the device manufacturer would determine when and where the semiconductor device 100 would be subjected to the energy beam treatment.

It should be noted at this point in the discussion that the materials and features used in the manufacture of the isolation structures 310, sidewall spacers 710 and pre-metal dielectric layer 1310 may be chosen by the manufacturer based upon the energy beam treatment that may be used. For instance, the manufacturer, knowing the specifics of the energy beam treatment, could choose the materials and features of any one or collection of the isolation structures 310, sidewall spacers 710 and pre-metal dielectric layer 1310 based upon a desired amount of stress. If larger stresses were desired, the materials chosen might be such that they provide greater amounts of stress for a given energy beam treatment. If smaller stresses were desired, the materials chosen might be such that they provide lesser amounts of stress for a given energy beam treatment. Thus, the inventive aspects of the present invention are adaptable, and thus may be tailored for many different desires of the manufacturer.

The method of manufacturing the semiconductor device as discussed with respect to FIGS. 1-14 provides many benefits over the prior art methods. Initially, the method allows the manufacturer to easily tailor the stress in the channel region based upon the timing and amount of the energy beam treatment, as well as the materials being subjected to the energy beam treatment. Furthermore, it allows for stress levels generally not easily attainable using the prior art processes. Moreover, use of the energy beam treatment is easy to integrate into existing manufacturing processes.

Figure 15:
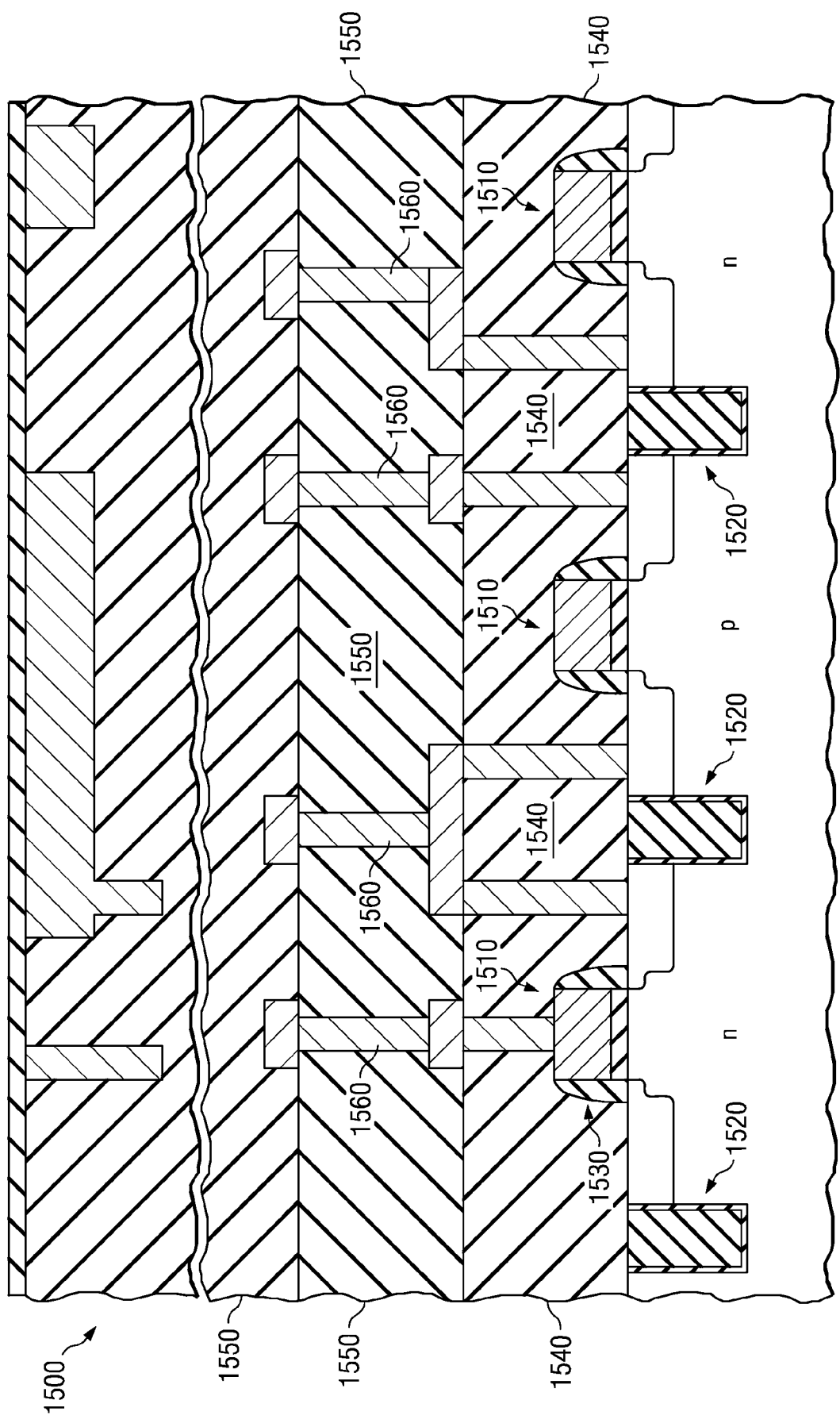
FIG. 15 illustrates a cross-sectional view of an integrated circuit (IC) having been manufactured using the inventive aspects of the present invention.

Referring finally to FIG. 15, illustrated is a cross-sectional view of an integrated circuit (IC) 1500 having been manufactured using the inventive aspects of the present invention. The IC 1500 may include devices, such as transistors used to form CMOS devices, BiCMOS devices, Bipolar devices, as well as capacitors or other types of devices. The IC 1500 may further include passive devices, such as inductors or resistors, or it may also include optical devices or optoelectronic devices. Those skilled in the art are familiar with these various types of devices and their manufacture. In the particular embodiment illustrated in FIG. 15, the IC 1500 includes the devices 1510, which in this embodiment are n-type metal oxide semiconductor (NMOS) and p-type metal oxide semiconductor (PMOS) device. The devices 1510 include isolation structures 1520, sidewall spacers 1530, as well as a pre-metal dielectric layer 1540. Located over the pre-metal dielectric layer 1540 are dielectric layers 1550. Additionally, interconnects 1560 (e.g., including contacts, vias, runners, etc.) are located within the pre-metal dielectric layer 1540 and the dielectric layers 1550. As a result of the inventive aspects used to form the NMOS and PMOS devices, and more particularly the isolation structures 1520, sidewall spacers 1530, as well as a pre-metal dielectric layer 1540, the NMOS devices might have an increased tensile stress in a channel region thereof, and the PMOS devices might have an increased compressive stress in the channel thereof. The resulting IC 1500 is optimally configured as an operational integrated circuit.

Those skilled in the art to which the invention relates will appreciate that other and further additions, deletions, substitutions and modifications may be made to the described embodiments without departing from the scope of the invention.

What is claimed is:

1. A method for manufacturing a semiconductor device, comprising:

forming an isolation structure within a semiconductor substrate;

subjecting at least a portion of the isolation structure to a first energy beam treatment, the first energy beam treatment configured to change a stress of the at least a portion of the isolation structure within the semiconductor substrate, and thus change a stress in the substrate;

forming a gate structure over the semiconductor substrate;

forming at least a portion of gate sidewall spacers proximate sidewalls of the gate structure;

after performing the first energy beam treatment, subjecting the at least a portion of the gate sidewall spacers to a second energy beam treatment, the second energy beam treatment configured to change a stress of the at least a portion of the gate sidewall spacers, and thus change a stress in the substrate therebelow;

forming a pre-metal dielectric layer over the isolation structure and over the gate structure; and after performing the second energy beam treatment, subjecting at least a portion of the pre-metal dielectric layer to a third energy beam treatment, the third energy beam treatment configured to change a stress of the at least a portion of the pre-metal dielectric layer, and thus change a stress in the semiconductor substrate.

2. The method as recited in claim 1 wherein the second energy beam treatment includes subjecting the at least a portion of the gate sidewall spacers to an ultraviolet (UV) energy beam treatment.

3. The method as recited in claim 1 wherein the second energy beam treatment includes subjecting the at least a portion of the gate sidewall spacers to an electron beam treatment.

4. The method as recited in claim 1 wherein the at least a portion of the isolation structure and the gate sidewall spacers comprise oxide.

5. The method as recited in claim 1 wherein the at least a portion of the isolation structure, the gate sidewall spacers, and the pre-metal dielectric layer comprise nitride.

6. The method as recited in claim 1 wherein the at least a portion of the gate sidewall spacers is an offset portion.

7. The method as recited in claim 1 wherein the at least a portion of the gate sidewall spacers is an L-shaped portion.

8. The method as recited in claim 1 wherein the at least a portion of the gate sidewall spacers is a bulk portion.

9. The method as recited in claim 1 wherein the forming at least a portion of the gate sidewall spacers includes forming an entire gate sidewall spacer, and wherein the second energy beam treatment includes subjecting the entire gate sidewall spacer to the second energy beam treatment.

10. The method as recited in claim 1 wherein the forming at least a portion of the gate sidewall spacers includes first selecting a gate sidewall material based upon the energy beam treatment that is going to be used and a desire to increase the amount of change in stress in the substrate, and then forming the at least a portion of the gate sidewall spacers.

11. The method as recited in claim 1 wherein the semiconductor device is an N-channel metal oxide semiconductor (NMOS) device, and further wherein the changed stress is an increased tensile stress in a channel region of the N-channel metal oxide semiconductor (NMOS) device.

12. The method as recited in claim 1 wherein the semiconductor device is a P-channel metal oxide semiconductor (PMOS) device, and further wherein the changed stress is an increased compressive stress in a channel region of the P-channel metal oxide semiconductor (PMOS) device.

13. A method for manufacturing an integrated circuit, comprising:

forming an isolation structure within a semiconductor substrate;

subjecting at least a portion of the isolation structure to a first energy beam treatment, the first energy beam treatment configured to change a stress of the at least a portion of the isolation structure within the semiconductor substrate, and thus change a stress in the substrate;

forming gate structures over the semiconductor substrate;

forming at least a portion of gate sidewall spacers proximate sidewalls of the gate structures;

after performing the first energy beam treatment, subjecting the at least a portion of the gate sidewall spacers to a second energy beam treatment, the second energy beam treatment configured to change a stress of the at least a portion of the gate sidewall spacers, and thus change a stress in the substrate therebelow;

forming a pre-metal dielectric layer over the isolation structure and over the gate structure;

after performing the second energy beam treatment, subjecting at least a portion of the pre-metal dielectric to a third energy beam treatment, the third energy beam treatment configured to change a stress of the at least a portion of the pre-metal dielectric layer, and thus change a stress in the substrate; and forming interconnects within dielectric layers located over the gate structures and within the pre-metal dielectric layer, the interconnects configured to contact the gate structures.

14. The method as recited in claim 13 wherein the second energy beam treatment includes subjecting the at least a portion of the gate sidewall spacers to an ultraviolet (UV) energy beam treatment.

15. The method as recited in claim 13 wherein the forming at least a portion of the gate sidewall spacers includes forming an entire gate sidewall spacer, and wherein the second energy beam treatment includes subjecting the entire gate sidewall spacer to the second energy beam treatment.

16. The method as recited in claim 13 wherein the forming at least a portion of the gate sidewall spacers includes first selecting a gate sidewall material based upon the energy beam treatment that is going to be used and a desire to increase the amount of change in stress in the substrate, and then forming the at least a portion of the gate sidewall spacers.

17. A semiconductor device, comprising:

a semiconductor substrate;

isolation structures within the semiconductor substrate, at least a portion of each isolation structure subjected to a first energy beam treatment to impart a stress to the substrate at a location between isolation structures;

a gate structure located over the substrate;

sidewall spacers located proximate a sidewall of the gate structure, at least a portion of the sidewall spacers subjected to a second energy beam treatment to impart a stress in the substrate therebelow; and a pre-metal dielectric layer over the isolation structures and over the gate structure, at least a portion of the pre-metal dielectric layer subjected to a third energy beam treatment to impart a stress in the substrate.

* * * * *